(12) United States Patent
Hyun et al.

(10) Patent No.: US 9,589,980 B2
(45) Date of Patent: Mar. 7, 2017

(54) SEMICONDUCTOR DEVICE AND METHOD OF MANUFACTURING THE SAME

(71) Applicant: SK hynix Inc., Gyeonggi-do (KR)

(72) Inventors: Chan Sun Hyun, Gyeonggi-do (KR); Wan Soo Kim, Seoul (KR); Myung Kyu Ahn, Gyeonggi-do (KR); Young Bin Ko, Gyeonggi-do (KE)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/258,720

(22) Filed: Apr. 22, 2014

(65) Prior Publication Data

US 2015/0155295 A1    Jun. 4, 2015

(30) Foreign Application Priority Data

Dec. 2, 2013    (KR) .................. 10-2013-0148722

(51) Int. Cl.
| | |
|---|---|
| H01L 27/115 | (2006.01) |
| H01L 29/423 | (2006.01) |
| H01L 29/66 | (2006.01) |
| H01L 29/788 | (2006.01) |
| H01L 29/792 | (2006.01) |
| H01L 45/00 | (2006.01) |
| H01L 27/24 | (2006.01) |

(52) U.S. Cl.
CPC .. *H01L 27/11582* (2013.01); *H01L 27/11556* (2013.01); *H01L 27/2472* (2013.01); *H01L 29/42332* (2013.01); *H01L 29/66825* (2013.01); *H01L 29/66833* (2013.01); *H01L 29/7889* (2013.01); *H01L 29/7926* (2013.01); *H01L 45/04* (2013.01)

(58) Field of Classification Search
CPC ......... H01L 27/11582; H01L 27/11556; H01L 29/7926; H01L 27/1157; H01L 29/66833
See application file for complete search history.

(56) References Cited

U.S. PATENT DOCUMENTS

| | | | | |
|---|---|---|---|---|
| 2011/0291177 | A1* | 12/2011 | Lee et al. .................. | 257/324 |
| 2012/0100700 | A1* | 4/2012 | Kim ........................... | 438/478 |
| 2012/0273867 | A1* | 11/2012 | Ko et al. .................... | 257/324 |

FOREIGN PATENT DOCUMENTS

| | | | |
|---|---|---|---|
| KR | 1020110068590 | * | 6/2011 |
| KR | 1020110093213 | | 8/2011 |
| KR | 101083637 | | 11/2011 |
| KR | 1020120068392 | | 6/2012 |

* cited by examiner

Primary Examiner — Tony Tran
(74) Attorney, Agent, or Firm — IP & T Group LLP

(57) ABSTRACT

A semiconductor device includes first semiconductor patterns with protrusions formed on the sidewalls thereof, and second semiconductor patterns respectively coupled to the first semiconductor patterns and increasing in width away from joining surfaces where the first semiconductor patterns and the second semiconductor patterns are coupled.

9 Claims, 16 Drawing Sheets

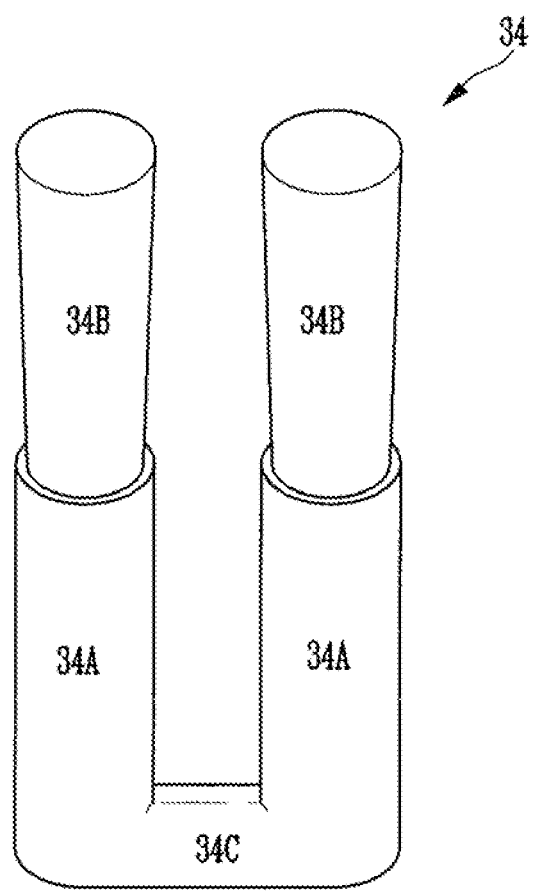

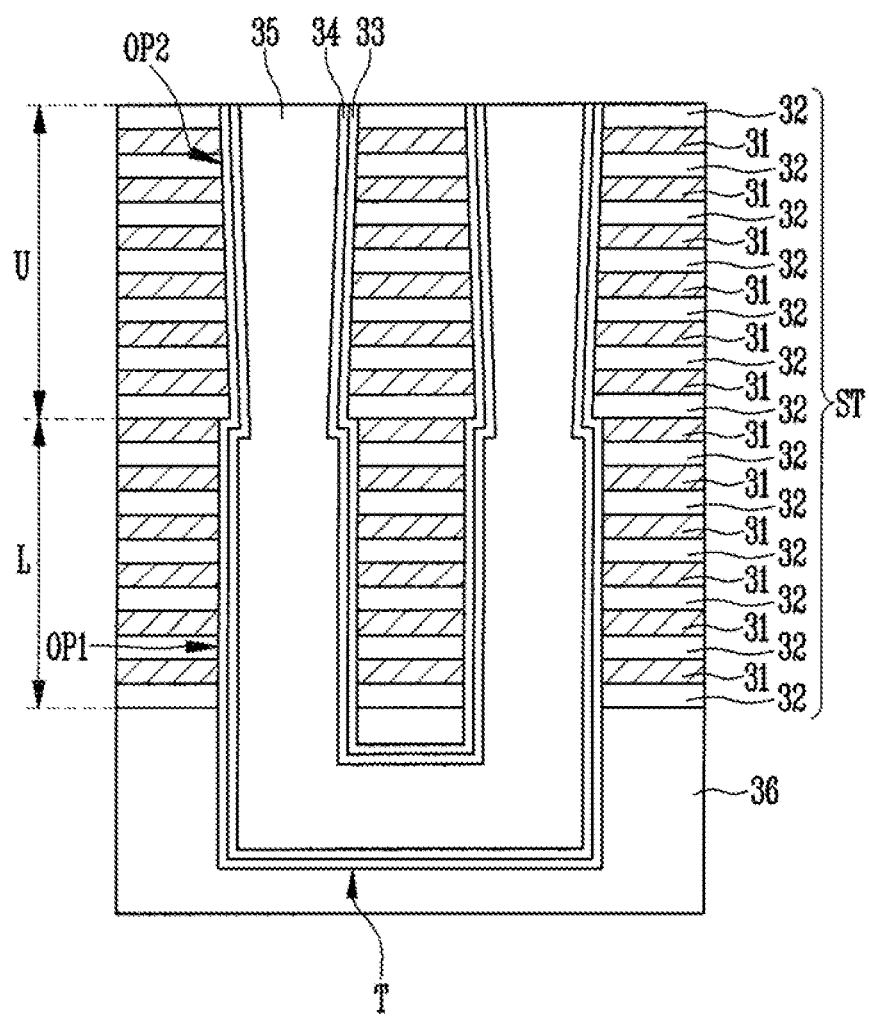

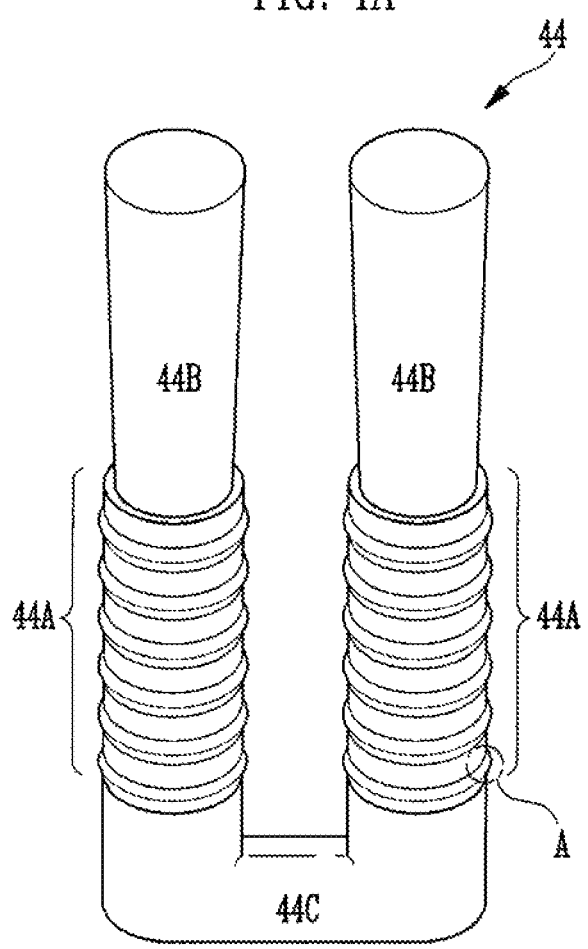

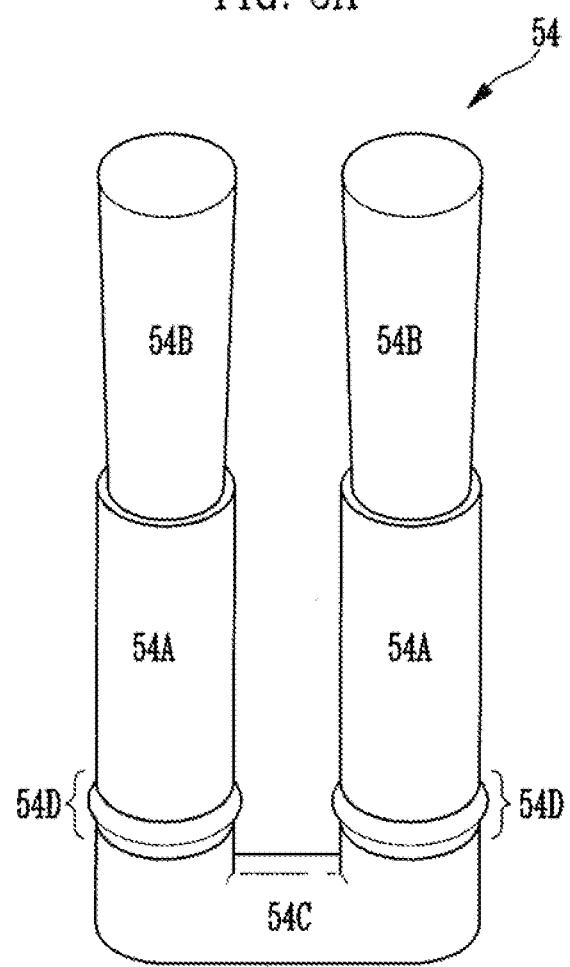

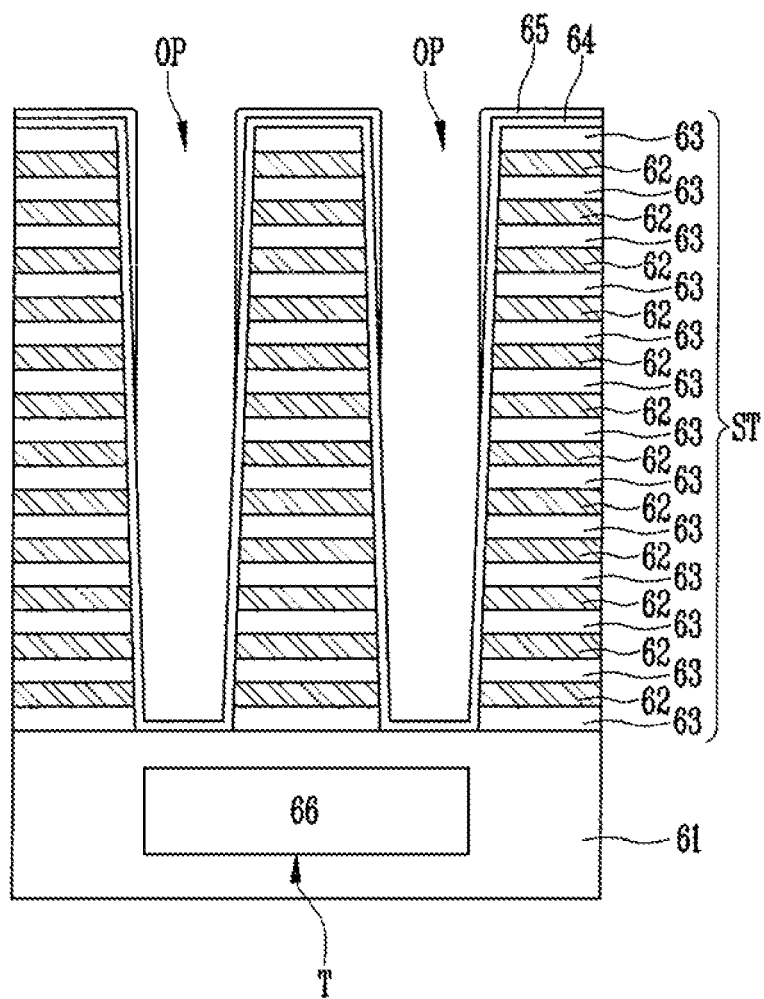

SEMICONDUCTOR DEVICE AND METHOD OF MANUFACTURING THE SAME

CROSS-REFERENCE TO RELATED APPLICATION

The present application claims priority to Korean patent application number 10-2013-0148722, filed on Dec. 2, 2013, the entire disclosure of which is herein incorporated in its entirety by reference.

BACKGROUND

Field of Invention

Various exemplary embodiments of the present invention relate generally to an electronic device and a method of manufacturing the same and, more particularly, to a semiconductor device and a method of manufacturing the same.

Description of Related Art

A non-volatile memory device retains data even in the absence of a power supply. Two-dimensional memory devices in which memory cells are fabricated in a single layer over a silicon substrate have reached physical limits in Increasing their degree of integration. Accordingly, three-dimensional non-volatile memory devices in which memory cells are stacked in a vertical direction over a silicon substrate have been proposed.

In a conventional three-dimensional non-volatile memory device, conductive layers and insulating layers may be alternately stacked to form a stacked structure, and a channel layer may pass through the stacked structure, so that a plurality of stacked memory cells may be formed at the same time. However, the higher the stacked structure is, the more difficult it is to form a desired channel layer. Due to limitations in the etching process, the channel layer may decrease in width from top to bottom. As a result, stacked memory cells may have non-uniform characteristics.

SUMMARY

Exemplary embodiments of the present invention are directed to a semiconductor device having uniform characteristics and a method of manufacturing the same.

A semiconductor device according to an exemplary embodiment of the present invention may include first semiconductor patterns with protrusions formed on the sidewalls thereof coupled to second semiconductor patterns that increase in width going away from the surface where the first and second semiconductor patterns are coupled.

A semiconductor device according to another exemplary embodiment of the present invention may include a stacked structure, first openings formed through a lower part of the stacked structure with grooves formed in inner walls thereof, and second openings formed through an upper part of the stacked structure and respectively coupled to the first openings, wherein the second openings increase in width from bottom to top.

A semiconductor device according to still another exemplary embodiment of the present invention may include first semiconductor patterns having a uniform width from top to bottom, and second semiconductor patterns respectively coupled to the first semiconductor patterns and increasing in width away from joining surfaces where the first semiconductor patterns and the second semiconductor patterns are coupled.

A method of manufacturing a semiconductor device according to still another exemplary embodiment of the present invention may include alternately forming a plurality of first material layers and a plurality of second material layers, forming openings through the first material layers and the second material layers, wherein the inner walls of the openings include upper inner walls and lower inner walls, forming a protective layer covering the upper inner walls of the openings, and forming grooves in the lower inner walls of the openings by selectively etching the first material layers exposed through the protective layer.

BRIEF DESCRIPTION OF THE DRAWINGS

FIGS. 1A to 5A are perspective views illustrating semiconductor patterns according to embodiments of the present invention, and FIGS. 1B to 5B are cross-sectional views illustrating semiconductor devices according to embodiments of the present invention;

FIGS. 6A to 6F are cross-sectional views illustrating a method of manufacturing a semiconductor pattern and a semiconductor device according to an embodiment of the present invention;

DETAILED DESCRIPTION

Figure 1A:
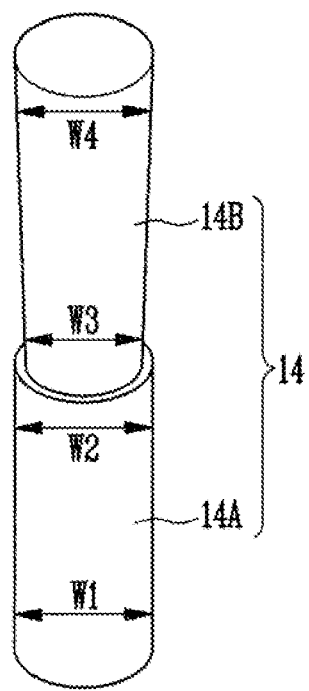

Hereinafter, various embodiments will be described with reference to the accompanying drawings. In the drawings, illustrated thicknesses and distances of components are exaggerated for convenience of illustration. In the following description, detailed explanation of known related functions and constitutions is omitted to avoid unnecessarily obscuring the subject matter disclosed herein. Throughout the disclosure, reference numerals correspond directly to the like numbered parts in the various figures and embodiments of the present invention.

It is also noted that in this specification, "connected/coupled" refers to one component not only directly coupling another component but also indirectly coupling another component through an intermediate component. In addition, a singular form may include a plural form as long as it is not specifically mentioned in a sentence. Furthermore, 'include/comprise' or 'including/comprising' used in the specification represents that one or more components, steps, operations, and elements exists or are added.

It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

Figure 1B:
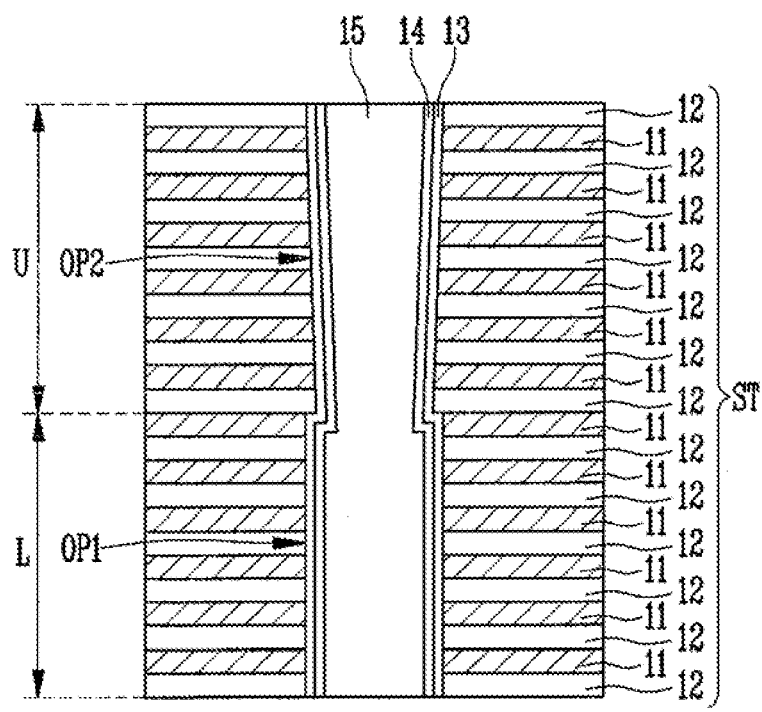

FIG. 1A is a perspective view illustrating a semiconductor pattern according to an embodiment of the present invention. FIG. 1B is a cross-sectional view illustrating a semiconductor device according to an embodiment of the present invention.

As illustrated in FIG. 1A, a semiconductor pattern 14 according to an embodiment may include a first semiconductor pattern 14A and a second semiconductor pattern 14B coupled to the first semiconductor pattern 14A. The first semiconductor pattern 14A may have a uniform width (W1=W2). A width of the second semiconductor pattern 14B may increase in a longitudinal direction (W3<W4). For example, the second semiconductor pattern 14B may increase in width as it extends away from a joining surface where the first semiconductor pattern 14A and the second semiconductor pattern 14B are joined. In addition, at the joining surface of the first and second semiconductor patterns 14A and 14B, the width of the first semiconductor pattern 14A may be greater than or equal to that of the second semiconductor pattern 14B.

The first and second semiconductor patterns 14A and 14B may be connected to each other in a single layer or may include a plurality of layers formed through separate processes. In addition, each of the first and second semiconductor patterns 14A and 14B may include a polysilicon layer. FIG. 1A illustrates the semiconductor pattern 14 having a circular cross-section. However, the semiconductor pattern 14 may have various cross-sections such as circular, elliptical, polygonal and linear cross-sections.

As illustrated in FIG. 1B, a semiconductor device according to an embodiment may include a stacked structure ST, a first opening OP1 and a second opening OP2. The first opening OP1 may be formed through a lower part L of the stacked structure ST. The second opening OP2 may be formed through an upper part U of the stacked structure ST. A width of the first opening OP1 may be uniform from top to bottom, and a width of the second opening OP2 may increase from bottom to top. In addition, the width of the first opening OP1 may be greater than or equal to the width of the second opening OP2 at a joining surface where the first opening OP1 and the second opening OP2 are joined.

The stacked structure ST may include conductive layers 11 and insulating layers 12 that are alternately formed. The conductive layers 11 may have the same thickness or different thicknesses. For example, at least one uppermost conductive layer 11 and at least one lowermost conductive layer 11 may be gate electrodes of selection transistors, and the remaining conductive layers 11 may be memory cells. In another example, at least one uppermost conductive layer 11 may be a gate electrode of a selection transistor, and the remaining conductive layers 11 may be gate electrodes of memory cells. The gate electrode of the selection transistor and the gate electrode of the memory cell may have different thicknesses. For example, the gate electrode of the selection transistor may have a greater thickness than the gate electrode of the memory cell.

The semiconductor device according to an embodiment may further include the semiconductor pattern 14 passing through the stacked structure ST. The semiconductor pattern 14 may be a channel layer of memory cells or a selection transistor. The semiconductor pattern 14 may include the first semiconductor pattern 14A formed in the first opening OP1 and the second semiconductor pattern 14B formed in the second opening OP2.

The width of the first semiconductor pattern 14A may be uniform from top to bottom, and the second semiconductor pattern 14B may increase in width from bottom to top. In addition, the semiconductor pattern 14 may have a completely filled central portion, an open central portion, or a combination thereof. An insulating layer 15 may be formed in the open central portion of the semiconductor pattern 14.

In addition, the semiconductor device according to an embodiment may further include a memory layer 13 surrounding the semiconductor pattern 14. The memory layer 13 may include a tunnel insulating layer, a data storage layer and a charge blocking layer. For example, the data storage layer may include a trap layer such as a nitride layer, a polysilicon layer, a nanodot, and a phase-change material layer.

As described above, since memory cells are stacked by using the semiconductor pattern 14 having uniform width from top to bottom as a channel layer, the stacked gate electrodes may have uniform resistance. Therefore, the threshold voltage distribution of the stacked memory cells may be improved, and disturbance characteristics may be improved by reducing the program voltage level.

Figure 2A:
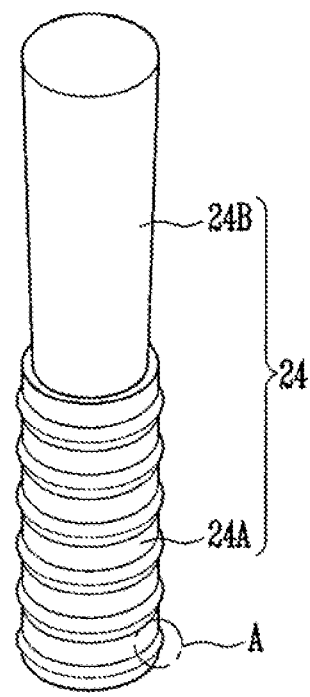
Figure 2B:
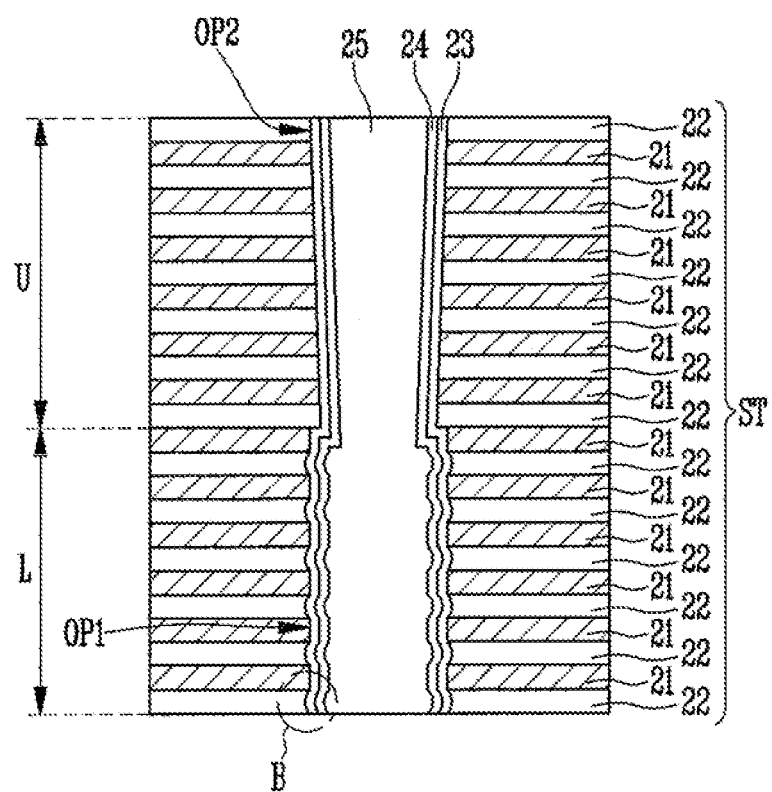

FIG. 2A is a perspective view illustrating a semiconductor pattern according to an embodiment of the present invention. FIG. 2B is a cross-sectional view illustrating a semiconductor device according to an embodiment of the present invention. Hereinafter, a description of the contents of the semiconductor pattern and the semiconductor device according to the embodiments, which are the same as those of the semiconductor pattern and the semiconductor device of the earlier embodiments, will be omitted.

As illustrated in FIG. 2A, a semiconductor pattern 24 according to an embodiment may include a first semiconductor pattern 24A and a second semiconductor pattern 24B coupled to the first semiconductor pattern 24A. The first semiconductor pattern 24A may include protrusions A on a sidewall thereof and have a uniform width. The second semiconductor pattern 24B may increase in width in a longitudinal direction.

As Illustrated in FIG. 2B, a semiconductor device according to an embodiment may include a stacked structure ST, a first opening OP1 and a second opening OP2. The first opening OP1 may be formed through a lower part L of the stacked structure ST. The second opening OP2 may be formed through an upper part U of the stacked structure ST. The first opening OP1 may include grooves B formed in an inner wall thereof and have a uniform width from top to bottom. In addition, the width of the second opening OP2 may increase from bottom to top.

The stacked structure ST may include conductive layers 21 and insulating layers 22 that are alternately formed. Each of the conductive layers 21 or each of the insulating layers 22 may include a groove B formed in an exposed sidewall of the first opening OP1. In addition, the groove B may be curved or rounded.

The semiconductor device according to an embodiment may further include the semiconductor pattern 24 passing through the stacked structure ST. The semiconductor pattern 24 may include the first semiconductor pattern 24A formed in the first opening OP1 and the second semiconductor pattern 24B formed in the second opening OP2. The semiconductor pattern 24 may have a completely filled central portion, an open central portion, or a combination thereof. An insulating layer 25 may be formed in the semiconductor pattern 24.

In addition, the semiconductor device may further include a memory layer 23 surrounding the semiconductor pattern 24. The memory layer 23 may include a tunnel insulating layer, a data storage layer and a charge blocking layer. For example, the data storage layer may include a trap layer such as a nitride layer, a polysilicon layer, a nanodot, and a phase-change material layer.

FIG. 3A is a perspective view illustrating a semiconductor pattern according to an embodiment of the present invention. FIG. 3B is a cross-sectional view illustrating a semiconductor device according to an embodiment of the present invention. Hereinafter, a description of the contents of the semiconductor pattern and the semiconductor device according to the embodiments, which are the same as those of the semiconductor pattern and the semiconductor device of the earlier embodiments, will be omitted.

As illustrated in FIG. 3A, a semiconductor pattern 34 according to an embodiment may include at least two first semiconductor patterns 34A, at least two second semiconductor patterns 34B coupled to the first semiconductor patterns 34A, and a third semiconductor pattern 34C coupling the at least two first semiconductor patterns 34A. The first semiconductor patterns 34A may have a uniform width, and the second semiconductor patterns 34B may increase in width in a longitudinal direction.

As illustrated in FIG. 3B, a semiconductor device according to an embodiment may include a first conductive layer 36, a stacked structure ST formed over the first conductive layer 36, first openings OP1, second openings OP2 and a trench T.

The stacked structure ST may include conductive layers 31 and insulating layers 32 that are alternately formed. The first openings OP1 may be formed through a lower part L of the stacked structure ST, and the second openings OP2 may be formed through an upper part U of the stacked structure ST. In addition, the trench T may be formed in the first conductive layer 36 and couple at least two first openings OP1. The first opening OP1 may have a uniform width from top to bottom. The second opening OP2 may increase in width from bottom to top.

The semiconductor device according to an embodiment may further include the semiconductor pattern 34 passing through the stacked structure ST. The semiconductor pattern 34 may include first semiconductor patterns 34A formed in the first openings OP1, second semiconductor patterns 34B formed in the second openings OP2 and a third semiconductor pattern 34C formed in the trench T. The semiconductor pattern 34 may have a completely filled central portion, an open central portion, or a combination thereof. An insulating layer 35 may be formed in the semiconductor pattern 34.

In addition, the semiconductor device according to an embodiment may further include a memory layer 33 surrounding the semiconductor pattern 34. The memory layer 33 may include a tunnel insulating layer, a data storage layer and a charge blocking layer. For example, the data storage layer may include a trap layer such as a nitride layer, a polysilicon layer, a nanodot, and a phase-change material layer.

Figure 4B:
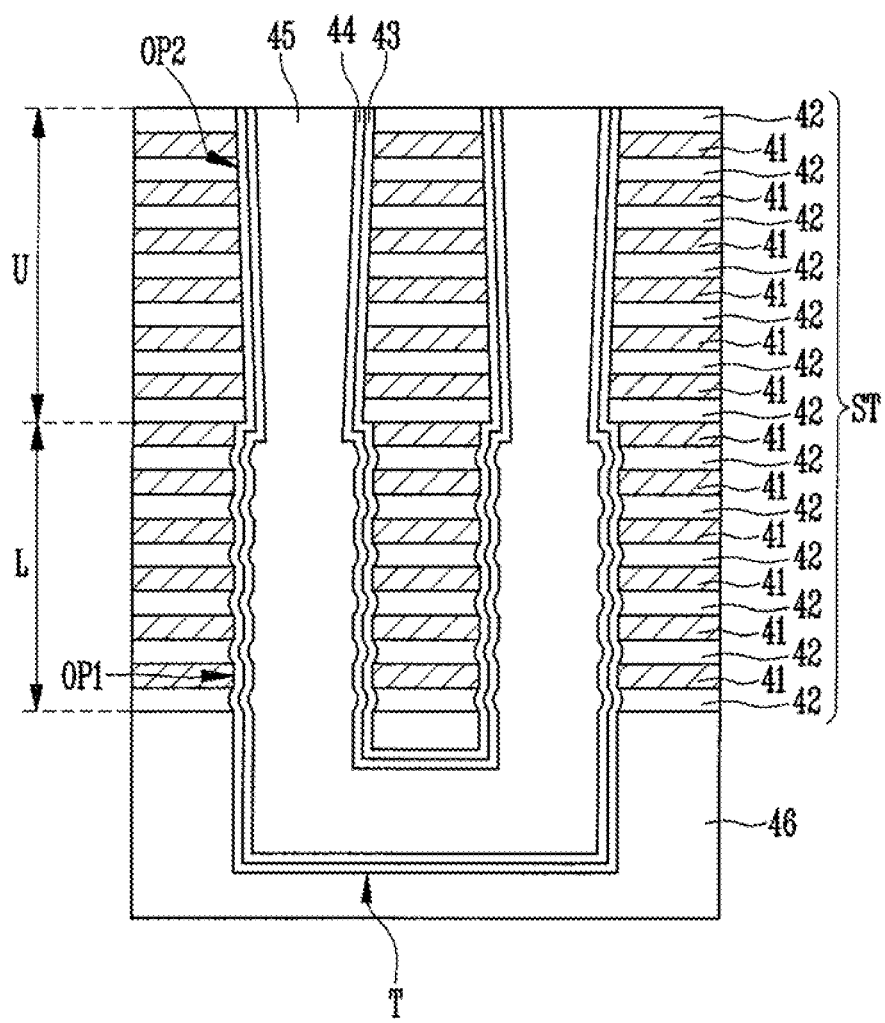

FIG. 4A is a perspective view illustrating a semiconductor pattern according to an embodiment of the present invention. FIG. 4B is a cross-sectional view illustrating a semiconductor device according to an embodiment of the present invention. Hereinafter, a description of the contents of the semiconductor pattern and the semiconductor device according to the embodiments which are the same as those of the semiconductor pattern and the semiconductor device of the earlier embodiments will be omitted.

As illustrated in FIG. 4A, a semiconductor pattern 44 according to an embodiment of the present invention may include at least two first semiconductor patterns 44A, at least two second semiconductor patterns 44B coupled to the first semiconductor patterns 44A, and a third semiconductor pattern 44C coupling at least two first semiconductor patterns 44A. Each of the first semiconductor patterns 44A may include protrusions A formed on a sidewall thereof and have a uniform width. In addition, the width of each of the second semiconductor patterns 44B may increase in a longitudinal direction.

As illustrated in FIG. 4B, a semiconductor device according to an embodiment may include a first conductive layer 46, a stacked structure ST formed over the first conductive layer 46, the first openings OP1, the second openings OP2 and a trench T.

The stacked structure ST may include conductive layers 41 and insulating layers 42 that are alternately formed. The first openings OP1 may be formed through a lower part L of the stacked structure ST. The second openings OP2 may be formed through an upper part U of the stacked structure ST. In addition, the trench T may be formed in the first conductive layer and couple at least two first openings OP1. Each of the first openings OP1 may include grooves formed in an inner wall thereof and have a uniform width from top to bottom. In addition, the width of each of the second opening OP2 may increase from bottom to top.

The semiconductor device according to an embodiment may further include the semiconductor pattern 44 passing through the stacked structure ST. The semiconductor pattern 44 may include first semiconductor patterns 44A formed in the first openings OP1 and second semiconductor patterns 44B formed in the second openings OP2. The semiconductor pattern 44 may have a completely filled central portion, an open central portion, or a combination thereof. An insulating layer 45 may be formed in the semiconductor pattern 44.

In addition, the semiconductor device according to an embodiment may further include a memory layer 43 surrounding the semiconductor pattern 44. The memory layer 43 may include a tunnel insulating layer, a data storage layer and a charge blocking layer. For example, the data storage layer may include a trap layer such as a nitride layer, a polysilicon layer, a nanodot, and a phase-change material layer.

Figure 5B:
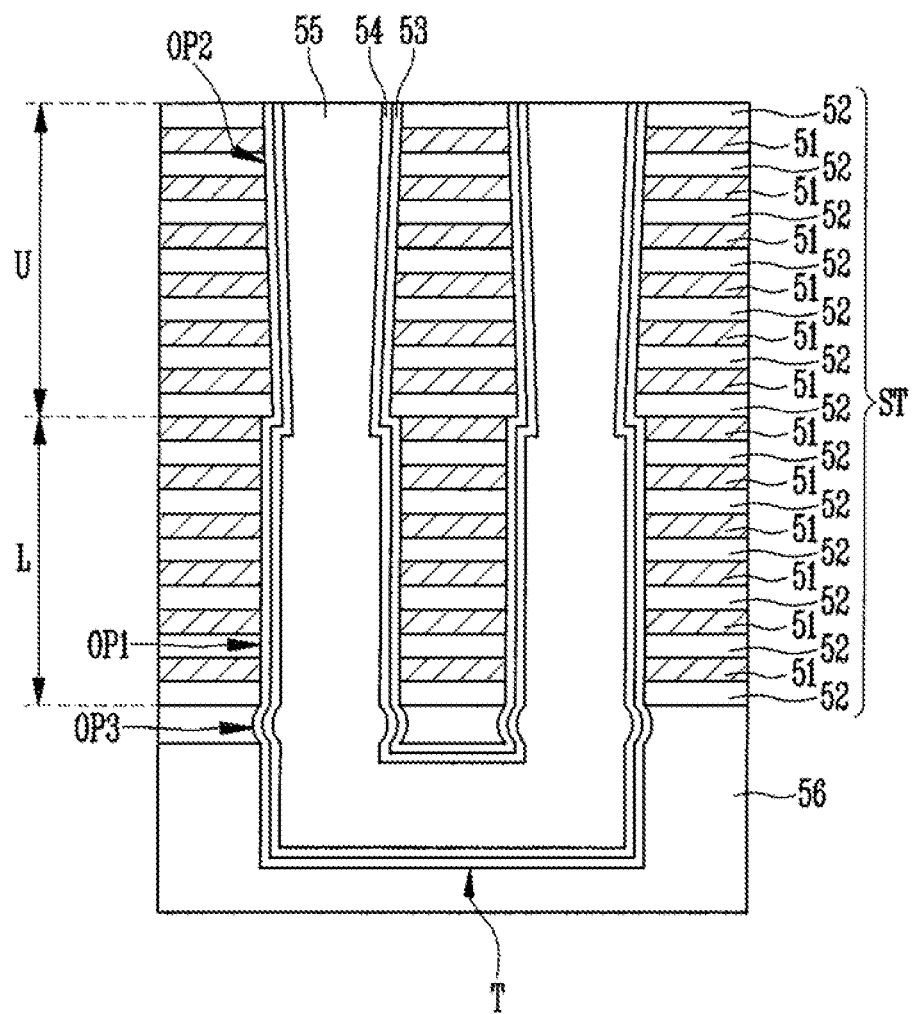

FIG. 5A is a perspective view illustrating a semiconductor pattern according to an embodiment of the present invention. FIG. 5B is a cross-sectional view illustrating a semiconductor device according to an embodiment. Hereinafter, a description of the contents of the semiconductor pattern and the semiconductor device according to the embodiments, which are the same as those of the semiconductor pattern and the semiconductor device of the earlier embodiments, will be omitted.

As illustrated in FIG. 5A, a semiconductor pattern 54 according to an embodiment may include at least two first semiconductor patterns 54A, at least two second semiconductor patterns 54B coupled to the first semiconductor patterns 54A, a third semiconductor pattern 54C coupling at least two first semiconductor patterns 54A, and fourth semiconductor patterns 54D. Each of the fourth semiconductor patterns 54D may be interposed between a corresponding one of the first semiconductor patterns 54A and the third semiconductor pattern 54C.

The first semiconductor patterns 54A may have a uniform width, and the second semiconductor patterns 54B may increase in width in a longitudinal direction. In addition, the fourth semiconductor pattern 54D may have a greater width than that of the first semiconductor pattern 54A. For example, a sidewall of the fourth semiconductor pattern 54D may have a curved outer surface.

As illustrated in FIG. 5B, a semiconductor device according to an embodiment may include a first conductive layer 56, a stacked structure ST formed over the first conductive layer 56, first openings OP1, second openings OP2, third openings OP3 and a trench T.

The stacked structure ST may include conductive layers 51 and insulating layers 52 that are alternately formed. The first openings OP1 may be formed through a lower part L of the stacked structure ST. The second openings OP2 may be formed through an upper part U of the stacked structure ST. The trench T may be formed in the first conductive layer and couple at least two first openings OP1. In addition, each of the third openings OP3 may be formed between a corresponding one of the first openings OP1 and the trench T, and may be located in the first conductive layer 56. The first opening OP1 may have a uniform width from top to bottom, the second opening OP2 may increase in width from bottom to top, and the third opening OP3 may have a greater width than that of the first opening OP1.

The semiconductor device may further include the semiconductor pattern 54 passing through the stacked structure ST. The semiconductor pattern 54 may include first semiconductor patterns 54A formed in the first opening OP1, second semiconductor patterns 54B formed in the second openings OP2, fourth semiconductor patterns 54D formed in the third openings OP3, and a third semiconductor pattern 54C formed in the trench T. The semiconductor pattern 54 may have a completely filled central portion, an open central portion, or a combination thereof. An insulating layer 55 may be formed in the semiconductor pattern 54.

In addition, the semiconductor device according to an embodiment may further include a memory layer 53 surrounding the semiconductor pattern 54. The memory layer 53 may include a tunnel insulating layer, a data storage layer and a charge blocking layer. For example, the data storage layer may include a trap layer such as a nitride layer, a polysilicon layer, a nanodot, and a phase-change material layer.

FIGS. 6A to 6F are cross-sectional views illustrating a method of manufacturing a semiconductor pattern and a semiconductor device according to an embodiment of the present invention.

As illustrated in FIG. 6A, a first conductive layer 61 that includes a trench T and a sacrificial layer 66 formed in the trench T. For example, after the trench T is formed in a conductive layer, the sacrificial layer 66 may be formed in the trench T. Subsequently, another conductive layer may be formed over the conductive layer including the sacrificial layer 66 to form the first conductive layer 61.

Subsequently, first material layers 62 and second material layers 63 may be alternately formed over the first conductive layer 61 to form a stacked structure. The first material layers 62 may be stacked to form conductive layers for gates. For example, at least one uppermost first material layer 62 may be stacked to form a selection gate of a selection transistor, and the remaining first material layers 62 may be stacked to form control gates of memory cells. The first material layers 62 may have the same thickness or different thicknesses according to purpose. In addition, the second material layers 63 may be stacked to form insulating layers electrically insulating the stacked conductive layers. The uppermost second material layer 63, among the second material layers 63, may function as a hard mask for preventing underlying layers from being damaged during subsequent processes such as forming of an opening. Therefore, the uppermost second material layer 63 may have a greater thickness than that of the remaining second material layers 63.

The first material layers 62 may include a material having a high etch selectivity with respect to the second material layers 63. For example, each of the first material layers 62 may include a sacrificial layer including a nitride, and each of the second material layers 63 may include an insulating layer including an oxide. In another example, each of the first material layers 62 may include a conductive layer including polysilicon, and each of the second material layers 63 may include an insulating layer including an oxide. In another example, each of the first material layers 62 may include a conductive layer including doped polysilicon, doped amorphous silicon or the like, and each of the second material layers 63 may include a sacrificial layer including undoped polysilicon, undoped amorphous silicon or the like. According to an embodiment, each of the first material layers 62 may include a sacrificial layer, and each of the second material layers 63 may include an insulating layer.

Subsequently, openings OP may be formed through the first and second material layers 62 and 63. The openings OP may be deep enough to expose the first conductive layer 61. In addition, the width of each of the openings OP may decrease from top to bottom.

Subsequently, a first protective layer 64 may be formed along inner surfaces of the openings OP. The first protective layer 64 may also be formed over the stacked structure as well as in the openings OP. The first protective layer 64 may include titanium (Ti), titanium nitride (TIN), tungsten (W) or aluminum (Al), or a combination thereof. In addition, the first protective layer 64 may include multilayers having high etch selectivity ratios with respect to each other. The first protective layer 64 may have a thickness ranging from about 10 to 200 Å.

Subsequently, a second protective layer 65 may be formed on the first protective layer 64. The thickness of the second protective layer 65 may decrease from top to bottom. The second protective layer 65 may be formed on upper inner walls of the openings OP and a top portion of the stacked structure, and may not be formed on lower inner walls of the openings OP. For example, the second protective layer 65 may be formed by a deposition method having poor step coverage. The second protective layer 65 may include a material having a high etch selectivity with respect to the first protective layer 64. For example, the second protective layer 65 may include an oxide, a nitride, or the like. The second protective layer 65 may be formed with a sufficient thickness in consideration of the amount of the second protective layer 65 to be lost during a subsequent process of forming grooves. The second protective layer 65 may have a thickness ranging from about 10 to 200 Å.

The first and second protective layers 64 and 65 formed over the stacked structure may be used to protect the earlier-formed layers in a subsequent etch process. For example, the first and second protective layers 64 and 65 may compensate for the thickness of the uppermost second material layer 63 lost in the process of forming the opening OP.

Figure 6B:
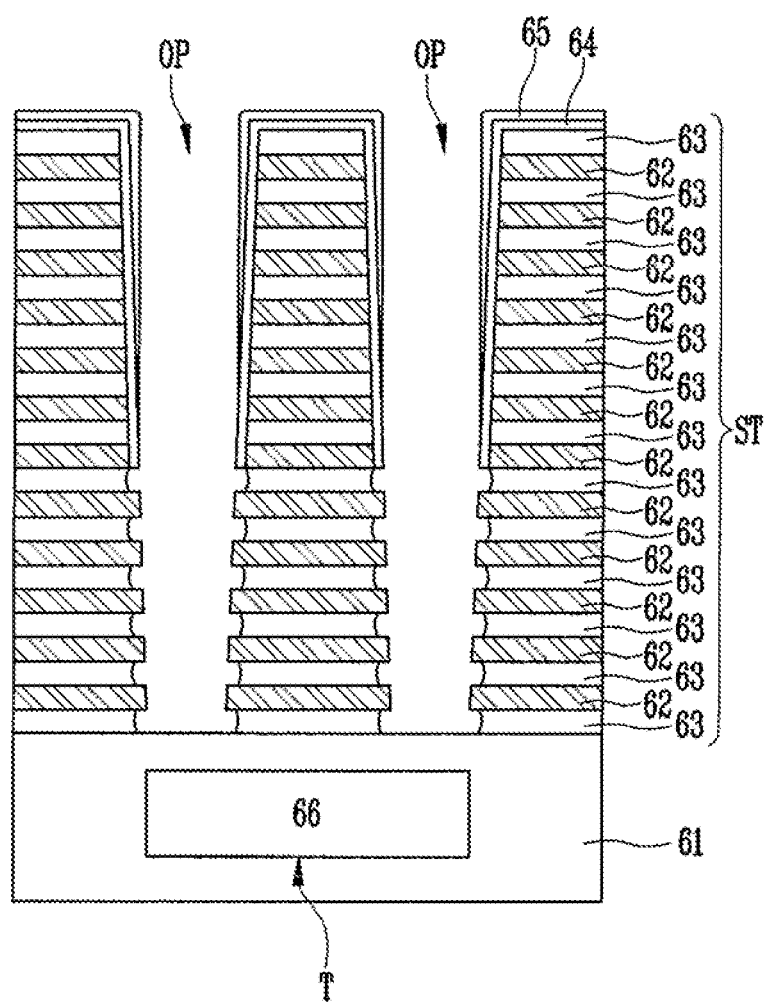

As Illustrated in FIG. 6B, the first protective layer 64 exposed through the openings OP may be removed by using the second protective layer 65 as a barrier. As a result, the first and second protective layers 64 and 65 may cover the upper inner walls of the openings OP. For example, the first protective layer 64 may be removed by a wet etch process using $H_2SO_4$. When the second protective layer 65 is also formed in lower parts of the openings OP, the first protective layer 64 may be removed after the second protective layer 65 in the lower parts of the openings OP is removed. For example, the second protective layer 65 may be removed by a plasma etch process or a wet etch process using a Buffered Oxide Etchant (BOE) or HF.

Subsequently, the first material layers 62 or the second material layers 63, exposed through the first and second protective layers 64 and 65, may be selectively etched.

When the first material layers 62 are etched, the second material layers 63 may protrude in the lower parts of the openings OP and grooves may be formed in sidewalls of the first material layers 62. When the second material layers 63 are etched, the first material layers 62 may protrude in the lower parts of the openings OP and grooves may be formed in sidewalls of the second material layers 63. The grooves may be curved or rounded. For example, the first material layers 62 or the second material layers 63 may be etched by a wet etch process using BOE, HF, $H_3PO_4$ or the like.

Figure 6C:
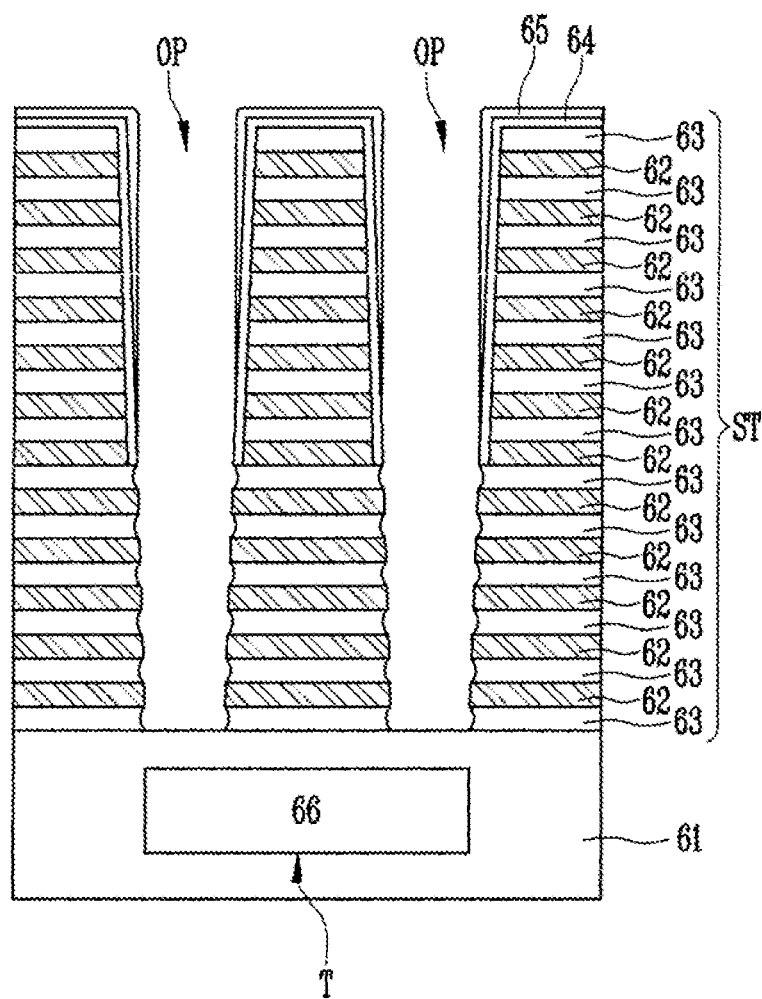

As illustrated in FIG. 6C, the first material layers 62 or the second material layers 63 may protrude in the lower parts of the openings OP. Protruding portions of the first material layers 62 or the second material layers 63 may be partially removed or completely removed. For example, the first material layers 62 or the second material layers 63 may be etched by the wet etch process using BOE, HF, $H_3PO_4$ or the like. However, the process for etching protruding portions as described with reference to FIG. 6C may be omitted.

Figure 6D:
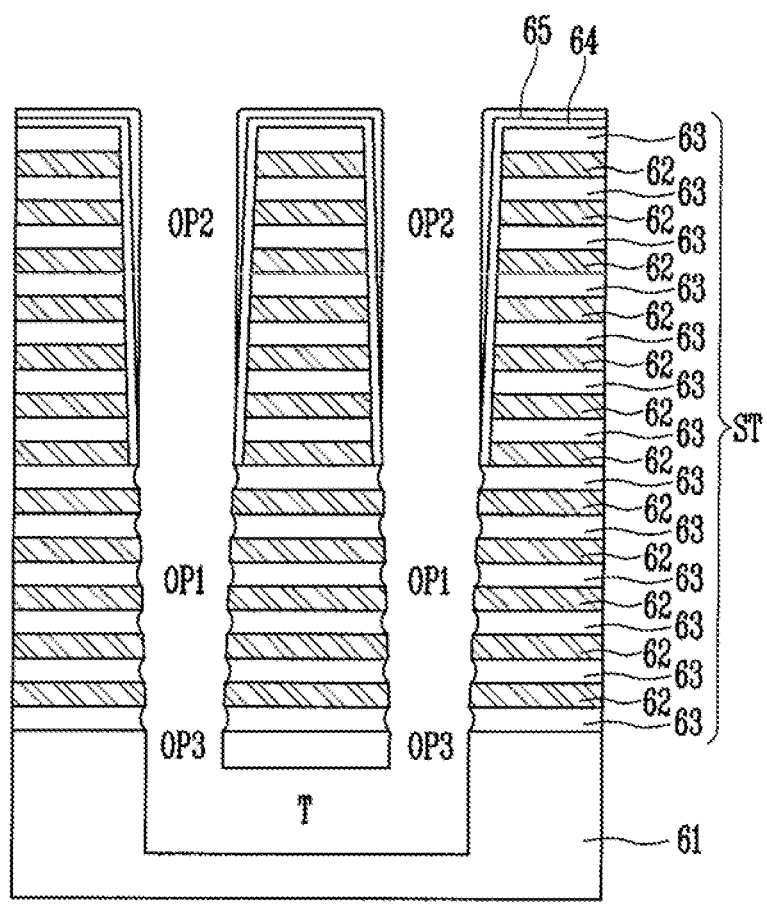

As illustrated in FIG. 6D, the first conductive layer 61 exposed on bottom surfaces of the openings OP may be etched so that the openings OP and the trench T may be coupled to each other. As a result, the openings OP may expand downward so that at least two openings OP may be coupled to the single trench T. Subsequently, the sacrificial layer 66 may be removed through the openings OP. As a result, first openings OP1, second openings OP2 coupled to the first openings OP1, the trench T, and third openings OP3 coupling the first openings OP1 and the trench T may be formed.

The third openings OP3 may have a sidewall having a round shape. For example, the first conductive layer 61 may be etched using a dry etch process or a wet etch process. Through the wet etch process, the third opening OP3 may have a greater width than that of the first opening OP1.

In addition, when the protruding portions of the first material layers 62 or the second material layers 63 remain on the inner walls of the first openings OP1, the protruding portions may also be etched when the first conductive layer 61 is etched. Therefore, the process described with reference to FIG. 6C may be omitted, and the protruding portions may be removed during the process illustrated in FIG. 6D. In addition, the protruding portions of the first material layers 62 or the second material layers 63 may remain without being completely removed.

Figure 6E:
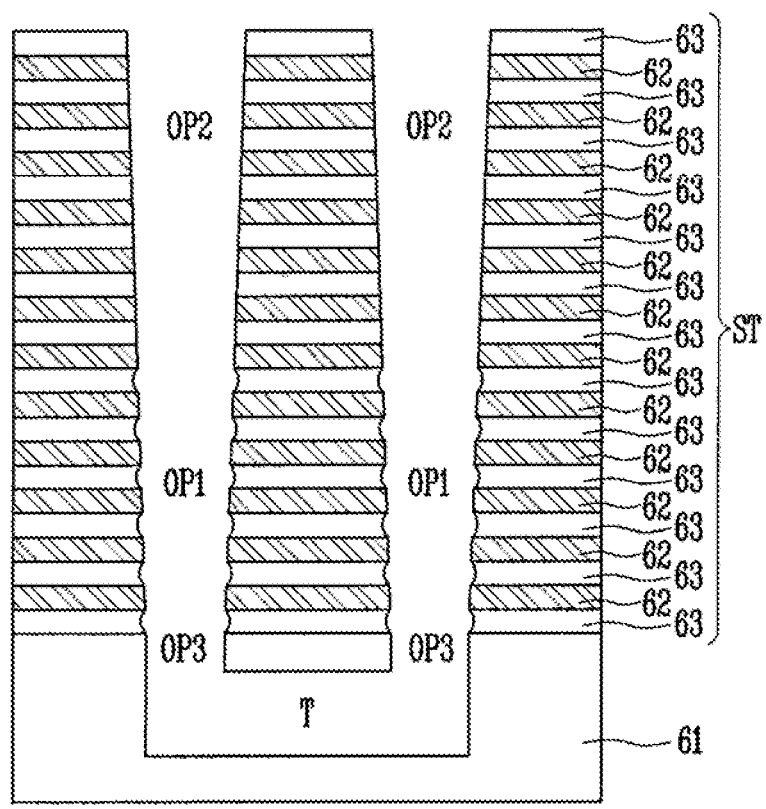

As illustrated in FIG. 6E, the remaining first and second protective layers 64 and 65 may be removed. For example, the first and second protective layers 64 and 65 may be removed by a wet etch process using $H_2SO_4$, $NH_4OH$ or the like.

The first opening OP1 may have a uniform width from top to bottom. The first opening OP1 may have grooves or protrusions on a sidewall thereof. Since the grooves or the protrusions are evenly distributed, the width of the first opening OP1 may be uniform from top to bottom. Therefore, the bottom widths of the initially formed openings OP may be increased and the top widths of the initially formed openings OP may not be changed. Thus, the widths of the second openings OP2 may increase from bottom to top or be substantially uniform from top to bottom. Here, the expression "substantially uniform" may cover a manufacturing error range. In addition, the third opening OP3 may have a width greater than or equal to that of the first opening OP1, and may include a sidewall curved or rounded.

Figure 6F:
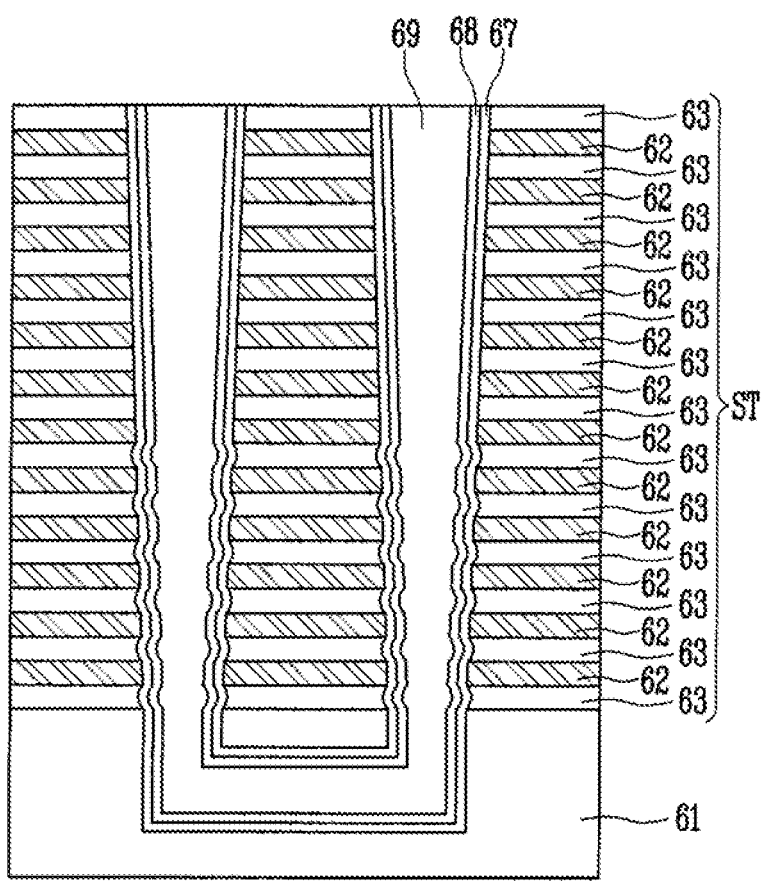

As illustrated in FIG. 6F, a memory layer 67, a semiconductor pattern 68 and an insulating layer 69 may be formed in the first to third openings OP1 to OP3 and the trench T.

The semiconductor pattern 68 may include first semiconductor patterns formed in the first openings OP1, second semiconductor patterns formed in the second openings OP2, third semiconductor patterns formed in the third openings OP3 and a fourth semiconductor pattern formed in the trench T.

Subsequently, though not shown in FIG. 6F, a slit may be additionally formed through the first and second material layers 62 and 63 between the first openings OP1 coupled through the single trench T, and subsequently, the first material layers 62 may be replaced by conductive layers through the slit. When the first material layers 62 include conductive layers and the second material layers 63 include insulating layers, a slit may be formed, and subsequently, the first material layers 62 may be silicided through the slit. When the first material layers 62 include conductive layers and the second material layers 63 include sacrificial layers, a slit may be formed, and subsequently, the second material layers 63 may be replaced by insulating layers.

According to the above-described processes, the opening OP having a uniform width from top to bottom and the semiconductor pattern 68 may be formed. Therefore, stacked memory cells may have uniform characteristics. In addition, since the first and second protective layers 63 and 64 protect the top surface of the stacked structure as well as the upper inner walls of the openings, the thickness of the uppermost second material layer 63 may be reduced. As a result, the height of the stacked structure may be reduced.

Figure 7:
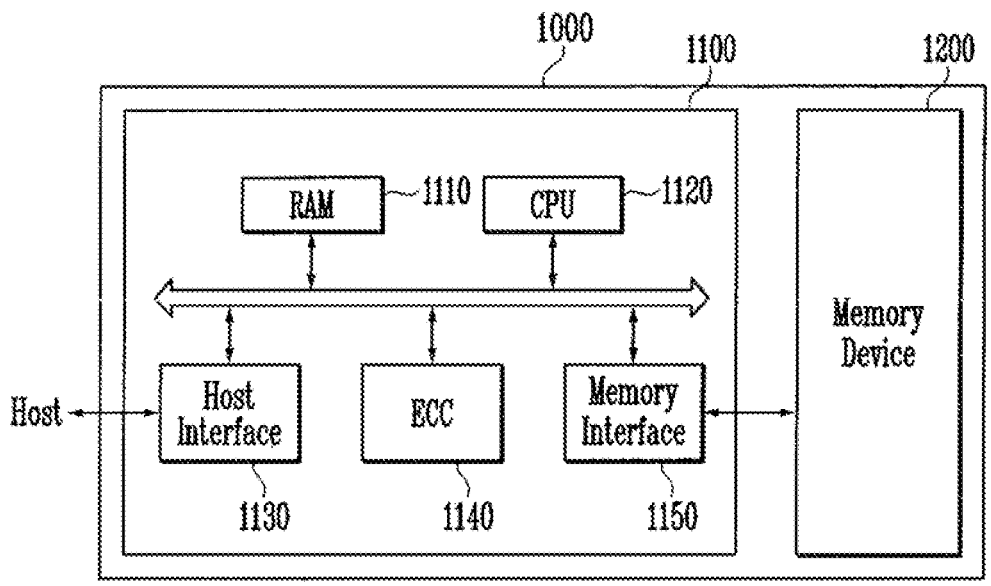
FIG. 7 is a block diagram illustrating the configuration of a memory system according to an embodiment of the present invention.

FIG. 7 is a block diagram illustrating the configuration of a memory system according to an embodiment of the present invention.

As illustrated in FIG. 7, a memory system 1000 according to an embodiment may include a memory device 1200 and a controller 1100.

The memory device 1200 may be used to store data information including various types of data such as text, graphic and software codes. The memory device 1200 may be a non-volatile memory and may be, for example, the semiconductor device described above with reference to FIGS. 1A to 6F. In addition, the memory device 1200 may include first semiconductor patterns including protrusions formed on sidewalls thereof and second semiconductor patterns coupled to the first semiconductor patterns and increasing in width from bottom to top. Since the memory device 1200 is formed and manufactured as described above, a detailed description thereof will be omitted.

The controller 1100 may be connected to a host and the memory device 1200, and may be suitable for accessing the memory device 1200 in response to a request from the host. For example, the controller 1100 may be suitable for controlling read, write, erase and background operations of the memory device 1200.

The RAM 1110 may be used as an operation memory, a cache memory between the memory device 1200 and the host, and a buffer memory between the memory device 1200 and the host. The RAM 1110 may be replaced by an SRAM (Static Random Access Memory), a ROM (Read Only Memory) or the like.

The CPU 1120 may be suitable for controlling overall operation of the controller 1100. For example, the CPU 1120 may be suitable for operating firmware such as an FTL (Flash Translation Layer) stored in the RAM 1110.

The host interface 1130 may be suitable for performing interfacing with the host. For example, the controller 1100 may communicate with the host through at least one of various protocols such as USB (Universal Serial Bus) protocol, MMC (MultiMedia Card) protocol, PCI (Peripheral Component Interconnection) protocol, PCI-E (PCI-Express) protocol, ATA (Advanced Technology Attachment) protocol, Serial-ATA protocol, Parallel-ATA protocol, SCSI (Small Computer Small Interface) protocol, ESDI (Enhanced Small Disk Interface) protocol, IDE (Integrated Drive Electronics) protocol and private protocol.

The ECC circuit 1140 may be suitable for detecting and correcting errors in data read from the memory device 1200 using the ECC.

The memory interface 1150 may be suitable for performing interfacing with the memory device 1200. For example, the memory interface 1150 may include a NAND interface or a NOR interface.

The controller 1100 may further include a buffer memory (not shown in FIG. 5) in order to store data temporarily. Here, the buffer memory may be used to temporarily store data delivered outside through the host interface 1130, or to temporarily store data delivered from the memory device 1200 through the memory interface 1150. In addition, the controller 1100 may further include a ROM to store code data for interfacing with the host.

As described above, since the memory system 1000 according to an embodiment includes the memory device 1200 having improved characteristics, characteristics of the memory system 1000 may be improved.

Figure 8:
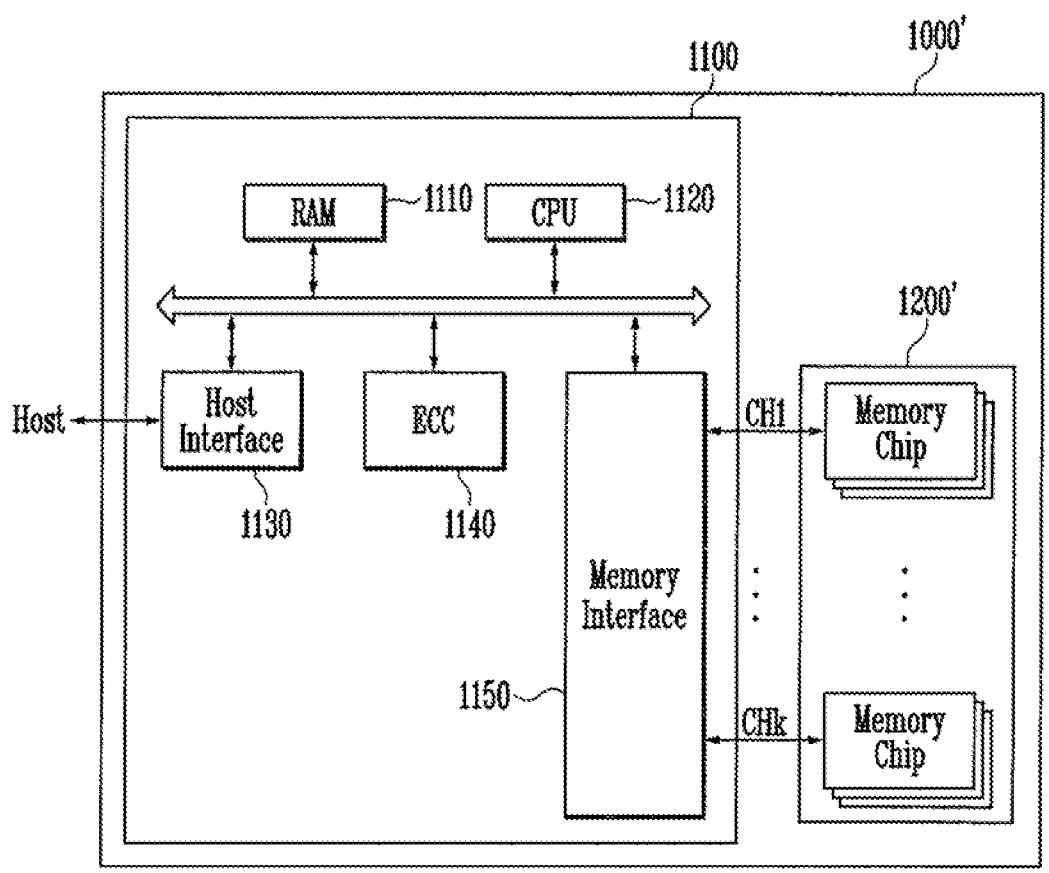
FIG. 8 is a block diagram illustrating the configuration of a memory system according to an embodiment of the present invention.

FIG. 8 is a block diagram illustrating the configuration of a memory system according to an embodiment of the present invention. Hereinafter, a description of the contents of the memory system according to the embodiment, which are the same as those of the memory system of the earlier embodiment, will be omitted.

As illustrated in FIG. 8, the memory system 1000 according to an embodiment may include a memory device 1200' and the controller 1100. In addition, the controller 1100 may include a RAM 1110, a CPU 1120, a host interface 1130, an ECC circuit 1140 and a memory interface 1150.

The memory device 1200' may be a non-volatile memory and may be, for example, the semiconductor device described above with reference to FIGS. 1A to 6F. In addition, the memory device 1200' may include first semiconductor patterns including protrusions formed on sidewalls thereof and second semiconductor patterns coupled to the first semiconductor patterns and having a width increasing from bottom to top. Since the memory device 1200' is formed and manufactured as described above, a detailed description thereof will be omitted.

In addition, the memory device 1200' may be a multi-chip package including a plurality of memory chips. The memory chips may be divided into a plurality of groups. The groups may be suitable for communicating with the controller 1100 through first to k-th channel CH1 to CHk. The memory chips belonging to one group may be suitable for communicating with the controller 1100 through a common channel. The memory system 1000' may be modified so that a single memory chip may be coupled to a single channel.

As described above, since the memory system 1000' according to an embodiment includes the memory device 1200' having improved characteristics, characteristics of the memory system 1000' may also be improved. By forming the memory device 1200' as a multi-chip package, data storage capacity and driving speed of the memory system 1000' may be increased.

Figure 9:
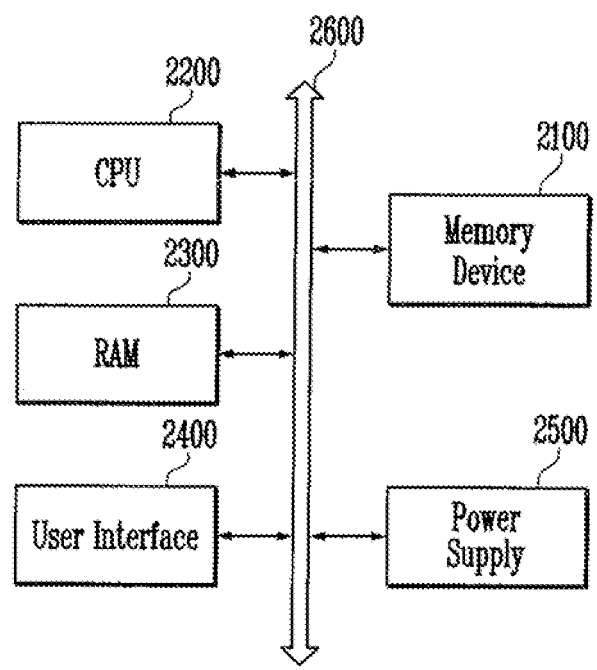
FIG. 9 is a block diagram illustrating the configuration of a computing system according to an embodiment of the present invention.

FIG. 9 is a block diagram illustrating the configuration of a computing system according to an embodiment of the present invention. Hereinafter, a description of the contents of the computing system according to the embodiment, which are the same as those of the semiconductor device of the earlier embodiment, will be omitted.

As shown in FIG. 9, a computer system 2000 according to an embodiment may include a memory device 2100, a CPU 2200, a RAM 2300, a user interface 2400, a power supply 2500 and a system bus 2600.

The memory device 2100 may store data provided through the user interface 2400 and data processed by the CPU 2200. The memory device 2100 may be electrically connected to the CPU 2200, the RAM 2300, the user interface 2400 and the power supply 2500 through the system bus 2600. For example, the memory device 2100 may be connected to the system bus 2600 through a controller (not shown in FIG. 7) or directly connected to the system bus 2600. When the memory device 2100 is directly connected to the system bus 2600, functions of the controller may be performed by the CPU 2200 and the RAM 2300.

The memory device 2100 may be non-volatile memory and may be, for example, the semiconductor device described above with reference to FIGS. 1A to 6F. The memory device 2100 may include first semiconductor patterns including protrusions formed on sidewalls thereof and second semiconductor patterns coupled to the first semiconductor patterns and having a width increasing from bottom to top. Since the memory device 2100 is formed and manufactured as described above, a detailed description thereof will be omitted.

In addition, the memory device 2100 may be a multi-chip package including a plurality of memory chips as described with reference to FIG. 8.

The computer system 2000 having such a configuration may be a computer, a UMPC (Ultra Mobile PC), a workstation, a net-book, a PDA (Personal Digital Assistant), a portable computer, a web tablet, a wireless phone, a mobile phone, a smart phone, an e-book, a PMP (Portable Multimedia Player), a portable game console, a navigation device, a black box, a digital camera, a 3-dimensional television, a digital audio recorder, a digital audio player, a digital picture recorder, a digital picture player, a digital video recorder, a digital video player, a device for wirelessly sending and receiving information, at least one of various electronic devices forming a home network, at least one of various electronic devices forming a computer network, at least one of various electronic devices forming a telematics network and an RFID device.

As described above, the computing system 2000 according to an embodiment includes the memory device 2100 having improved characteristics and therefore characteristics of the computing system 2000 as a whole may be improved.

Figure 10:
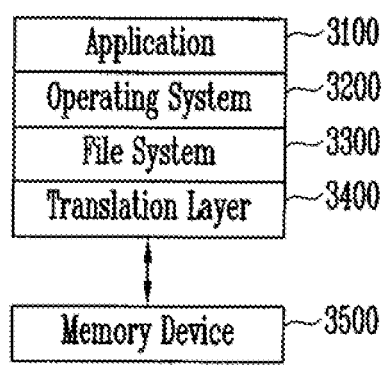
FIG. 10 is a block diagram illustrating a computing system according to an embodiment of the present invention.

FIG. 10 is a block diagram illustrating a computing system according to an embodiment of the present invention.

As shown in FIG. 10, a computing system 3000 according to an embodiment may include a software layer having an operating system 3200, an application 3100, a file system 3300, a translation layer 3400, and a hardware layer such as a memory device 3500.

The operating system 3200 may manage software resources and hardware resources of the computer system 3000 and control program execution by the CPU. The application 3100 may be various application programs executed in the computer system 3000 and may be a utility performed by the operating system 3200.

The file system 3300 may refer to a logical structure to manage data and files which exist in the computer system 3000. The file system 3300 may organize files or data to be stored in the memory device 3500 according to rules. The file system 3300 may be determined by the operating system 3200 used in the computer system 3000. For example, when the operating system 3200 is Microsoft Windows, the file system 3300 may be File Allocation Table (FAT) or NT File System (NTFS). In addition, when the operating system 3200 is Unix/Linux, the file system 3300 may be Extended File System (EXT), Unix File System (UFS) or Journaling File System (JFS).

In FIG. 10, the operating system 3200, the application 3100 and a file system 3300 are shown as separate blocks. However, the application 3100 and the file system 3300 may be included in the operating system 3200.

The translation layer 3400 may translate an address into an appropriate type for the memory device 3500 in response to a request from the file system 3300. For example, the translation layer 3400 may translate a logical address created by the file system 3300 into a physical address of the memory device 3500. Mapping information of the logical address and the physical address may be stored in an address translation table. For example, the translation layer 3400 may be a Flash Translation Layer (FTL) or a Universal Flash Storage Link Layer (ULL).

The memory device 3500 may be a non-volatile memory and may be, for example, the semiconductor device described above with reference to FIGS. 1A to 6F. In addition, the memory device 3500 may include first semiconductor patterns including protrusions formed on sidewalls thereof and second semiconductor patterns coupled to the first semiconductor patterns and having a width increasing in width from bottom to top. Since the memory device 3500 is formed and manufactured as described above, a detailed description thereof will be omitted.

The computer system 3000 having this configuration may be separated into an operating system layer performed in the upper level region and a controller layer performed in the lower level region. The application 3100, the operating system 3200 and the file system 3300 may be included in the operating system layer and may be driven by an operating memory of the computer system 3000. In addition, the translation layer 3400 may be included in the operating system layer or in the controller layer.

As described above, since the computing system 3000 according to an embodiment includes the memory device 3500 having improved characteristics, characteristics of the computing system 3000 may also be improved.

According to an embodiment of the present invention, an opening having a uniform width and a semiconductor pattern may be formed. Therefore, stacked memory cells having uniform characteristics may be formed by using the opening and the semiconductor pattern. In addition, reduction in height of a stacked structure may make manufacturing processes easier.

What is claimed is:

1. A semiconductor device, comprising:
   a first semiconductor pattern including a plurality of protrusions formed on a whole sidewall thereof, wherein the first semiconductor pattern vertically passes through first gate electrodes included in a lower part of gate electrodes of memory cells stacked each other;
   a second semiconductor pattern respectively coupled to the first semiconductor pattern and increasing in width away from joining surfaces where the first semiconductor pattern and the second semiconductor pattern are coupled, wherein the second semiconductor pattern vertically passes through second gate electrodes included in an upper part of gate electrodes of memory cells which are stacked over the lower part of the gate electrodes, wherein the protrusions are formed at a top gate electrode in the lower part of the gate electrodes stacked over each other, wherein the first semiconductor pattern has a greater width than that of the second semiconductor pattern at the joining surface, and each of the protrusions has a round shape;
   a third semiconductor pattern coupling at least two first semiconductor patterns; and
   fourth semiconductor patterns having a greater width than that of the first semiconductor patterns, wherein each of the fourth semiconductor patterns is interposed between a corresponding one of the first semiconductor patterns and the third semiconductor pattern.

2. The semiconductor device of claim 1, wherein the first semiconductor pattern has a uniform width from top to bottom.

3. The semiconductor device of claim 1, wherein the first semiconductor pattern and the second semiconductor pattern are channel layers of memory strings.

4. A semiconductor device, comprising:
   a stacked structure including first gate electrodes of memory cells and second gate electrodes of memory cells, wherein the second gate electrodes are stacked over the first gate electrodes;
   a first opening formed through a lower part of the stacked structure and including grooves formed in an inner wall thereof, wherein the first opening vertically passes through the first gate electrodes;
   a second opening formed through an upper part of the stacked structure and respectively coupled to the first opening, wherein the second opening increases in width from bottom to top, wherein the second opening vertically passes through the second gate electrodes, wherein the grooves are formed in a whole inner wall of the first opening, wherein each of the grooves has a round shape, wherein the first opening has a greater width than that of the second opening at joining surfaces where the first openings and the second openings are coupled;
   a first conductive layer formed under the stacked structure;
   a trench formed in the first conductive layer and coupled to at least two of the first opening; and
   a third opening formed between the first opening and the trench and having a greater width than that of the first opening.

5. The semiconductor device of claim 4, wherein the stacked structure includes conductive layers for the first and the second gate electrodes and insulating layers, formed alternately with each other.

6. The semiconductor device of claim 5, wherein the conductive layers protrude inward further than the insulating layers in the first opening, and the insulating layers include the grooves.

7. The semiconductor device of claim 5, wherein the insulating layers protrude inward further than the conductive layers in the first opening, and the conductive layers include the grooves.

8. The semiconductor device of claim 4, wherein the first opening has a uniform width from top to bottom.

9. A semiconductor device, comprising:
   a first semiconductor pattern having a uniform width from top to bottom, wherein the first semiconductor pattern vertically passes through first gate electrodes included in a lower part of gate electrodes of memory cells stacked each other, and includes a plurality of protrusions formed on a whole sidewall thereof, wherein each of the protrusions has a round shape; and a second semiconductor pattern respectively coupled to the first semiconductor pattern and increasing in width away from a joining surface where the first semiconductor pattern and the second semiconductor pattern are coupled, wherein the second semiconductor pattern vertically passes through second gate electrodes included in an upper part of gate electrodes which are stacked over the lower part of the gate electrodes, wherein the joining surface where the first semiconductor pattern and the second semiconductor pattern are coupled are formed at a top gate electrode in the lower part of the gate electrodes stacked over each other;

a third semiconductor pattern coupling at least two first semiconductor patterns;

a fourth semiconductor pattern interposed between the first semiconductor pattern and the third semiconductor pattern and having a greater width than that of the first semiconductor pattern.

\* \* \* \* \*